(12) United States Patent
Liu et al.

(10) Patent No.: US 9,825,062 B2
(45) Date of Patent: Nov. 21, 2017

(54) ARRAY SUBSTRATE WITH REDUNDANT GATE AND DATA LINE REPAIR STRUCTURES

(71) Applicants: BOE TECHNOLOGY GROUP CO., LTD., Beijing (CN); HEFEI XINGSHENG OPTOELECTRONICS TECHNOLOGY CO., LTD., Hefei, Anhui (CN)

(72) Inventors: Liping Liu, Beijing (CN); Junqi Han, Beijing (CN); Yu Ai, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 14/797,781

(22) Filed: Jul. 13, 2015

(65) Prior Publication Data

US 2016/0190161 A1    Jun. 30, 2016

(30) Foreign Application Priority Data

Dec. 29, 2014    (CN) .......................... 2014 1 0842106

(51) Int. Cl.
*H01L 27/12* (2006.01)
*G02F 1/1362* (2006.01)

(52) U.S. Cl.
CPC ...... *H01L 27/124* (2013.01); *G02F 1/136259* (2013.01); *H01L 27/1296* (2013.01)

(58) Field of Classification Search
CPC .......................... H01L 27/124; H01L 27/1296
See application file for complete search history.

(56) References Cited

U.S. PATENT DOCUMENTS

| | | | | |
|---|---|---|---|---|
| 4,804,953 A | * | 2/1989 | Castleberry | ........... G02F 1/1362 257/59 |
| 4,938,567 A | * | 7/1990 | Chartier | ............ G02F 1/136209 349/147 |

(Continued)

FOREIGN PATENT DOCUMENTS

| | | |
|---|---|---|
| CN | 1702530 A | 11/2005 |
| CN | 101887898 A | 11/2010 |
| CN | 102645802 A | 8/2012 |

OTHER PUBLICATIONS

First Chinese Office Action, for Chinese Patent Application No. 2014108421066, dated Dec. 28, 2016, 14 pages.

(Continued)

*Primary Examiner* — Asok K Sarkar
*Assistant Examiner* — Grant Withers
(74) *Attorney, Agent, or Firm* — Kinney & Lange, P.A.

(57) ABSTRACT

The present disclosure provides an array substrate and a method of manufacturing the same, and a display device comprising the array substrate. The array substrate comprises: a substrate; gate lines and data lines arranged to intersect one another on the substrate; a gate line connection conducting wire layer provided between the gate lines and the substrate and below the gate lines; and/or, a data line connection conducting wire layer provided in regions of the array substrate corresponding to the data lines; wherein the gate line connection conducting wire layer is electrically isolated from the data line connection conducting wire layer.

15 Claims, 4 Drawing Sheets

(56) References Cited

U.S. PATENT DOCUMENTS

| | | | | |
|---|---|---|---|---|
| 4,990,460 | A * | 2/1991 | Moriyama | G02F 1/1368 257/59 |
| 5,045,753 | A * | 9/1991 | Katayama | G02F 1/1309 313/494 |
| 5,303,074 | A * | 4/1994 | Salisbury | G02F 1/1309 257/292 |
| 5,334,860 | A * | 8/1994 | Naito | G02F 1/136286 257/59 |
| 5,559,345 | A * | 9/1996 | Kim | G02F 1/136286 257/59 |
| 7,161,226 | B2 * | 1/2007 | Chen | G02F 1/136286 257/522 |
| 7,250,992 | B2 * | 7/2007 | Lai | G02F 1/1368 349/38 |
| 7,471,351 | B2 * | 12/2008 | Choi | G02F 1/1362 349/139 |
| 7,638,371 | B2 * | 12/2009 | Chen | H01L 27/124 257/227 |
| 2004/0016925 | A1 | 1/2004 | Watamura | |
| 2005/0263769 | A1 * | 12/2005 | Chul Ahn | G02F 1/136286 257/72 |
| 2007/0166893 | A1 * | 7/2007 | Lee | H01L 27/124 438/151 |
| 2013/0214278 | A1 * | 8/2013 | Nam | H01L 27/1214 257/59 |

OTHER PUBLICATIONS

Chinese Rejection Decision dated Apr. 28, 2017, for Chinese Patent Application No. 2014108421066.

* cited by examiner

ARRAY SUBSTRATE WITH REDUNDANT GATE AND DATA LINE REPAIR STRUCTURES

CROSS-REFERENCE TO RELATED APPLICATION

This application claims the benefit of Chinese Patent Application No. 201410842106.6 filed on Dec. 29, 2014 in the State Intellectual Property Office of China, the whole disclosure of which is incorporated herein by reference.

BACKGROUND OF THE INVENTION

Field of the Invention

The present disclosure generally relates to the field of display technologies, and particularly, to an array substrate and a method of manufacturing the same, and a display device comprising the array substrate.

Description of the Related Art

A conventional TFT (Thin Film Transistor) substrate generally comprises structures such as a glass substrate, gate lines (Gate Lines) and data lines (Data Lines) and the like, wherein no conducting layer is provided below each of the Gate Line and the Data Line.

In the prior art, when the gate line is broken, it is often determined as occurrence of a No Good (NG) phenomenon. When the data line is broken, usually it is repaired and connected by means of only one or two repair lines on a peripheral region of a display panel in a conventional maintenance way. In such a case, if the number of broken data lines is larger than the number of the repair lines, the data lines cannot be repaired, resulting in that a product cannot be repaired effectively.

SUMMARY OF THE INVENTION

In view of the above, an object of the present disclosure is to provide an array substrate and a method of manufacturing the same, and a display device comprising the array substrate, thereby overcoming the problem, existing in the prior art, that no connection conducting wire layer is provided below the gate lines and/or in regions corresponding to the data lines, and the broken data line is repaired by means of only one or two repair lines around the data lines, so that the broken gate lines and data lines cannot be repaired effectively and the yield of products cannot be ensured.

In order to achieve the above object, one aspect of the present disclosure provides an array substrate, comprising a substrate, and gate lines and data lines arranged to intersect one another on the substrate, wherein the array substrate further comprises: a gate line connection conducting wire layer provided between the gate lines and the substrate and below the gate lines; and/or, a data line connection conducting wire layer provided in regions of the array substrate corresponding to the data lines; wherein the gate line connection conducting wire layer is electrically isolated from the data line connection conducting wire layer.

According to another aspect of the present disclosure, there is provided a display device comprising the above array substrate.

According to a further aspect of the present disclosure, there is provided a method of manufacturing an array substrate, comprising steps of:

forming a pattern of gate lines, and forming a pattern of a gate line connection conducting wire layer below the gate lines; and/or, forming a pattern of data lines, and forming a data line connection conducting wire layer in regions of the array substrate corresponding to the data lines;

wherein the gate line connection conducting wire layer is electrically isolated from the data line connection conducting wire layer.

DETAILED DESCRIPTION OF PREFERRED EMBODIMENTS OF THE INVENTION

Exemplary embodiments of the present invention will be described hereinafter in detail with reference to the attached drawings. The embodiments are intended to exemplarily illustrate the present invention, and should not be interpreted as being limitative to the scope of the present invention.

As shown in FIGS. 1-5, the present disclosure provides an array substrate, comprising: a substrate 1, and gate lines 2 and data lines 3 arranged to intersect one another on the substrate 1; a gate line connection conducting wire layer 4 provided between the gate lines 2 and the substrate 1 and below the gate lines 2; and/or, a data line connection conducting wire layer 7 provided in regions of the array substrate corresponding to the data lines; wherein the gate line connection conducting wire layer 4 is electrically isolated from the data line connection conducting wire layer 7, that is, there is no intersection region between the gate line connection conducting wire layer 4 and the data line connection conducting wire layer 7.

In one embodiment, the data line connection conducting wire layer 7 is located below the data lines 3. Of course, the data line connection conducting wire layer 7 may be located above the data lines 3.

When the gate line 2 is broken, the broken gate line 2 can be conducted through the gate line connection conducting wire layer 4 therebelow, thereby achieving reconnection of the gate line 2. On the other hand, when the data line 3 is broken, two disconnected ends of the broken data line 3 and the data line connection conducting wire layer 7 provided below or above the broken data line 3 can be bridged by a bonding wire, so that the broken data line 3 is reconnected. Since the data line connection conducting wire layer 7 is provided in regions of the array substrate corresponding to the data lines 3 (above or below a pattern of the data lines 3), a multi-point maintenance operation can be achieved for the data lines 3 so as to improve repair efficiency, thereby greatly improving quality of product. Of course, if both the gate line 2 and the data line 3 are broken, the broken gate line 2 and data line 3 may be connected respectively by the gate line connection conducting wire layer 4 and the data line connection conducting wire layer 7 in the same way as described above.

Figure 1:
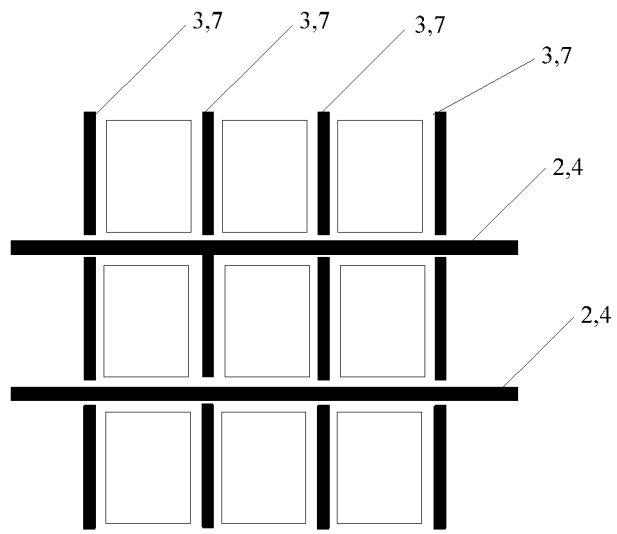
FIG. 1 is a schematic structural view of an array substrate according to an embodiment of the present disclosure.
Figure 2:
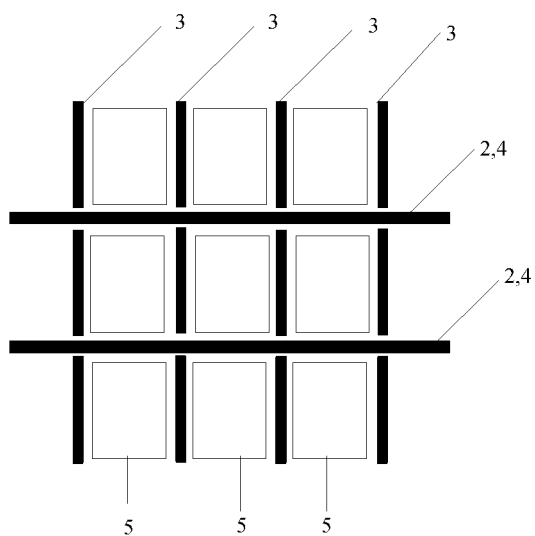
FIG. 2 is another schematic structural view of an array substrate according to an embodiment of the present disclosure.
Figure 3:
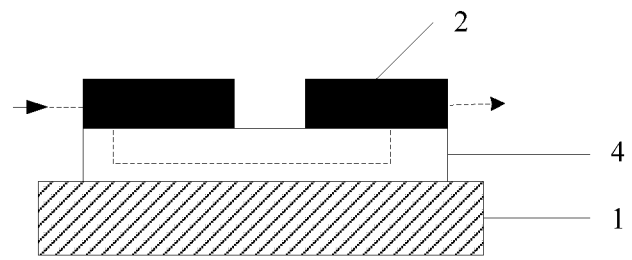
FIG. 3 is a structural view of a structure for repairing a gate line according to an embodiment of the present disclosure.

In a specific implementation, as shown in FIG. 1, illustrated is an example in which both the gate line connection conducting wire layer 4 and the data line connection conducting wire layer 7 are provided. As shown in FIG. 2, illustrated is an example in which the gate line connection conducting wire layer 4 is provided. The array substrate according to an embodiment of the present disclosure comprises: the substrate 1, and the gate lines 2 and the data lines 3 arranged to intersect one another on the substrate 1; and the gate line connection conducting wire layer 4 provided between the gate lines 2 and the substrate 1 and provided below the gate lines 2. Pixel electrode regions 5 are delimited between the gate lines 2 and the data lines 3, and the gate line connection conducting wire layer 4 is located directly under the gate lines 2, directly contacts and is connected with the gate lines 2, and is spaced away from the pixel electrode regions 5. With reference to FIG. 3, when the gate line 2 is broken, the broken gate line 2 can be conducted through the gate line connection conducting wire layer 4 therebelow, thereby achieving reconnection of the gate line 2.

Figure 4:
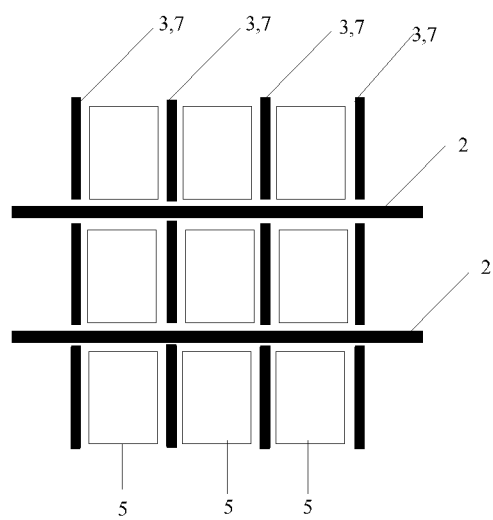
FIG. 4 is a further schematic structural view of an array substrate according to an embodiment of the present disclosure.
Figure 5:
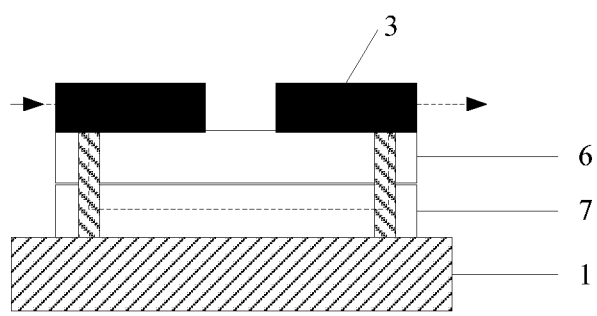
FIG. 5 is a schematic view of a structure for repairing a data line according to an embodiment of the present disclosure.

As shown in FIG. 4, illustrated is an example in which the data line connection conducting wire layer 7 is provided. The array substrate according to an embodiment of the present disclosure comprises: the substrate 1, and the gate lines 2 and the data lines 3 arranged to intersect one another on the substrate 1; and the data line connection conducting wire layer 7 provided between the data lines 3 and the substrate 1 and provided below the data lines. Pixel electrode regions 5 are delimited between the gate lines 2 and the data lines 3. The array substrate further comprises a gate insulation layer 6, the data line connection conducting wire layer 7 is located directly below the data lines 3, and the gate insulation layer 6 is located between the data lines 3 and the data line connection conducting wire layer 7. As shown in FIG. 5, which illustrates the data line configuration after bonding wires have been formed (that is, the hashed regions extending between substrate 1 and data line 3) when the data line 3 is broken, two disconnected ends of the broken data line 3 and the data line connection conducting wire layer 7 can be bridged by a bonding wire, so that the broken data line 3 is reconnected. Since the data line connection conducting wire layer 7 is provided in regions of the array substrate corresponding to the data lines 3 (for example, below a pattern of the data lines 3), a multi-point maintenance operation can be achieved for the data lines 3 so as to improve repair efficiency, thereby greatly improving quality of product.

In one embodiment, the above gate line connection conducting wire layer 4 and the data line connection conducting wire layer 7 may be the same one conducting layer, for example, may be an ITO (Indium Tin Oxide) conducting layer. It should be noted that besides the ITO conducting layer, other materials having the same or similar physical characteristics as the ITO may be used to manufacture the connection conducting wire layers.

It is noted that the array substrate provided according the embodiments of the present disclosure may be applicable to any TN and FFS type products.

In another aspect, the present disclosure further provides a display device, comprising the array substrate as described above.

The display device includes, but is not limited to, devices such as a liquid crystal display, a liquid crystal TV, a liquid crystal display screen or the like, and also may be a display device with a display module, such as a digital photo frame, an electronic paper, a mobile phone or the like.

Figure 7:
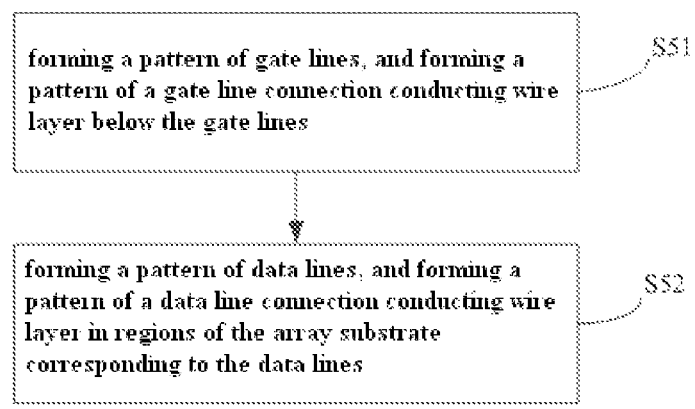
FIG. 7 is a flow chart showing a method of manufacturing an array substrate according to an embodiment of the present disclosure.

As shown in FIG. 7, a method of manufacturing the above array substrate according to embodiments of the present disclosure comprises:

step S51 of forming a pattern of gate lines 2, and forming a pattern of a gate line connection conducting wire layer 4 below the gate lines 2; and/or, step S52 of forming a pattern of data lines 3, and forming a data line connection conducting wire layer 7 in regions of the array substrate corresponding to the data lines 3, wherein the gate line connection conducting wire layer is electrically isolated from the data line connection conducting wire layer 7.

In one embodiment, the step S51 comprises: depositing an ITO conducting layer and a gate metal layer sequentially on a substrate 1, and processing the ITO conducting layer and the gate metal layer by performing a patterning process one time so as to form the pattern of the gate line connection conducting wire layer and the pattern of the gate lines, wherein the pattern of the gate line connection conducting wire extends along the pattern of the gate lines and finally overlaps with the pattern of the gate lines.

In one embodiment, the data line connection conducting wire layer 7 is located below the data lines 3, wherein the step S52 comprises:

forming the pattern of the data line connection conducting wire layer by performing a patterning process one time, the pattern of the data line connection conducting wire layer extending along the pattern of the data lines and finally overlapping with the pattern of the data lines, and being arranged to be disconnected at intersections between the gate lines and the data lines, wherein the data line connection conducting wire layer is formed below the data lines.

Figure 6:
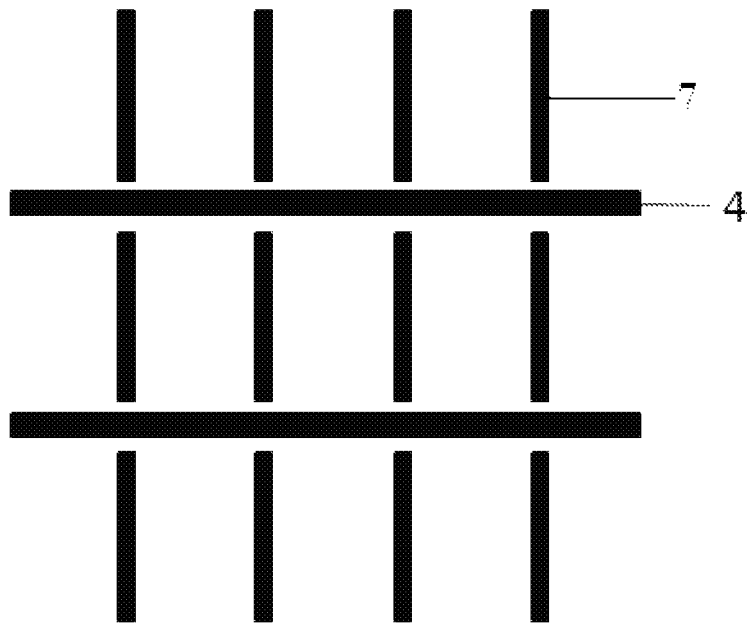
FIG. 6 is a schematic view showing an arrangement of a gate line connection conducting wire layer and a data line connection conducting wire layer in the array substrate according to an embodiment of the present disclosure.

In the above method, the ITO conducting layer is deposited on the substrate, a pattern of the ITO conducting layer is formed within regions corresponding to regions where the gate lines and the data lines are to be formed, and portions of the ITO conducting layer extending along a direction of gate line are disconnected from portions of the ITO conducting layer extending in a direction of data line, that is, the pattern of the gate line connection conducting wire layer within corresponding regions below the gate lines is a continuous metal line, while the pattern of the data line connection conducting wire layer within corresponding regions below the data lines is a discontinuous metal line, as shown in FIG. 6.

In a further embodiment, the gate insulation layer 6 is provided between the data lines 3 and the data line connection conducting wire layer 7, and specifically, the step S52 comprises:

depositing an ITO conducting layer within regions corresponding to regions where the data lines are to be formed, and forming a pattern of the data line connection conducting wire layer;

depositing a gate insulation layer, depositing a data line metal layer on the substrate formed with the gate insulation layer, and forming a pattern of the data lines, the data lines and the ITO pattern of the data line connection conducting wire layer are overlapped with each other and are spaced away from each other by the gate insulation layer.

In one embodiment, when the data line connection conducting wire layer is located directly below the data lines, the data line connection conducting wire layer and the gate line connection conducting wire layer located below the gate lines are provided in the same layer, that is, the same one connection conducting wire layer may be used for not only connecting the gate lines, but also for connecting the data lines via the bonding wire.

It is noted that the steps S51 and S52 may be separately implemented, that is, the gate line connection conducting wire layer is only provided below the gate lines, or the data line connection conducting wire layer is only provided at positions corresponding to regions where the data lines are to be formed. Of course, the steps S51 and S52 may be implemented simultaneously. The data line connection conducting wire layer may be provided directly above or below the data lines.

When the connection conducting wire layer is located directly above the data lines, the connection conducting wire layer and a pixel electrode layer in the array substrate may be formed at the same time, and the bonding wire is used to connect the broken data line.

Figure 8:
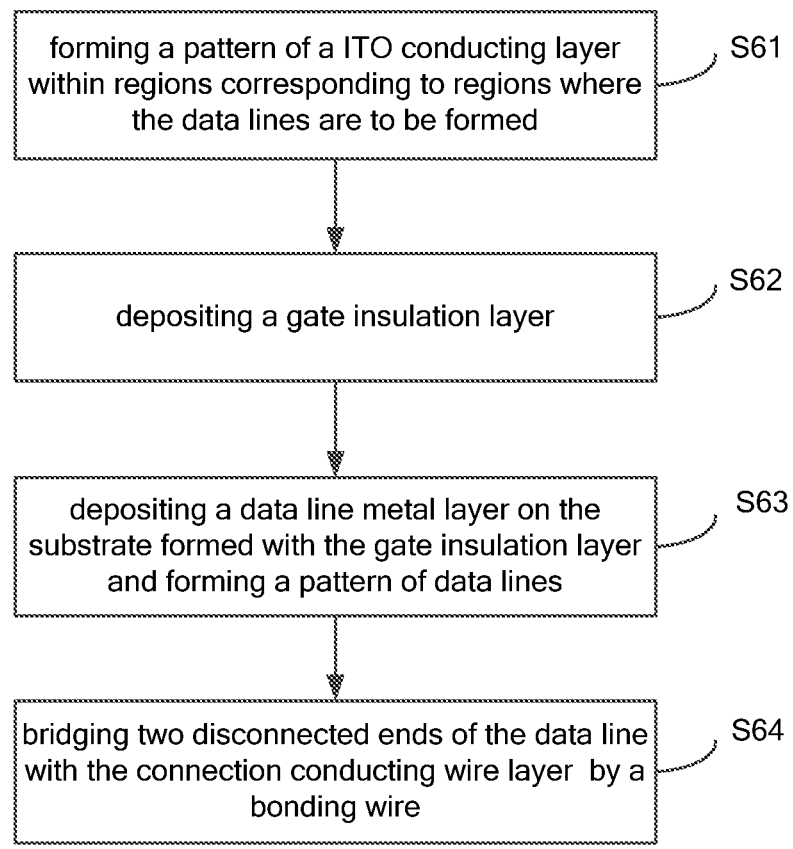
FIG. 8 is a flow chart showing a method of repairing an array substrate according to an embodiment of the present disclosure.

As shown in FIG. 8, a method of repairing the above array substrate according to an embodiment of the present disclosure comprises:

step S61 of forming a pattern of an ITO conducting layer within regions of the substrate corresponding to regions where the data lines are to be formed;

step S62 of depositing a gate insulation layer 6, step S63 of depositing a data line metal layer on the substrate formed with the gate insulation layer and forming a pattern of data lines;

step S64 of bridging two disconnected ends of the data line with the data line connection conducting wire layer 7 by a bonding wire.

With the method of repairing the array substrate provided according to the embodiment of the present disclosure, the data line connection conducting wire layer is provided at positions corresponding regions where the data lines are to be formed. When the data line is broken, two disconnected ends of the broken data line and the data line connection conducting wire layer can be bridged by a bonding wire, so that the broken data line is reconnected, thus a multi-point maintenance operation can be achieved for the data lines so as to improve repair efficiency, thereby improving quality of product to the greatest extent.

Although several exemplary embodiments have been shown and described, it would be appreciated by those skilled in the art that various changes or modifications may be made in these embodiments without departing from the principles and spirit of the disclosure, the scope of which is defined in the claims and their equivalents.

What is claimed is:

1. An array substrate, comprising a substrate, and gate lines and data lines arranged to intersect one another on the substrate, wherein the array substrate further comprises:

a gate line connection conducting wire layer provided between the gate lines and the substrate and below the gate lines, configured such that when any of the gate lines is broken, the broken gate lines can be conducted through the gate line connection conducing wire layer therebelow, thereby achieving reconnection of the gate lines;

a data line connection conducting wire layer provided in regions of the array substrate corresponding to the data lines; and a gate insulation layer located between the data lines and the data line connection conducting wire layer, to completely electrically insulate the data lines from the data line connection conducting wire layer, such that only the gate insulation layer is directly between the data lines and the data line connection conducting wire layer;

wherein pixel electrode regions are delimited between the gate lines and the data lines, wherein the gate line connection conducting wire layer is electrically isolated from the data line connection conducting wire layer; and wherein when any of the data lines is broken, two disconnected ends of the broken data line and the data line connection conducting wire layer are bridgeable by a bonding wire, so that the broken data line is reconnected.

2. The array substrate according to claim 1, wherein pixel electrode regions are delimited between the gate lines and the data lines, and the gate line connection conducting wire layer is located directly under the gate lines, directly contacts and is connected with the gate lines, and is spaced away from the pixel electrode regions.

3. The array substrate according to claim 1, wherein the data line connection conducting wire layer is located below the data lines.

4. The array substrate according to claim 1, wherein the data line connection conducting wire layer and the gate line connection conducting wire layer are provided in the same connection conducting wire layer.

5. The array substrate according to claim 1, wherein each of the data line connection conducting wire layer and the gate line connection conducting wire layer is an ITO conducting layer.

6. A display device comprising the array substrate according to claim 1.

7. The display device according to claim 6, wherein pixel electrode regions are delimited between the gate lines and the data lines, and the gate line connection conducting wire layer is located directly under the gate lines, directly contacts and is connected with the gate lines, and is spaced away from the pixel electrode regions.

8. The display device according to claim 6, wherein the data line connection conducting wire layer is located below the data lines.

9. The display device according to claim 8, wherein pixel electrode regions are delimited between the gate lines and the data lines, the data line connection conducting wire layer is located directly below the data lines.

10. The display device according to claim 9, wherein the data line connection conducting wire layer and the gate line connection conducting wire layer are provided in the same connection conducting wire layer.

11. A method of manufacturing an array substrate, comprising steps of:

forming a substrate, and forming gate lines and data lines arranged to intersect one another on the substrate;

forming a gate line connection conducting wire layer between the gate lines and the substrate and below the gate lines, such that when any of the gate lines are broken, the broken gate lines can be conducted through the gate line connection conducting wire layer therebelow, thereby achieving reconnection of the gate lines;

forming a data line connection conducting wire layer in regions of the array substrate corresponding to the data lines; and forming a gate insulation layer located between the data lines and the data line connection conducting wire layer, to completely electrically insulate the data lines from the data line connection conducting wire layer, such that only the gate insulating layer is directly between the data lines and the data line connection conducting wire layer, wherein pixel electrode regions are delimited between the gate lines and the data lines, wherein the gate line connection conducting wire layer is electrically isolated from the data line connection conducting wire layer; and wherein when any of the data lines is broken, two disconnected ends of the broken data line and the data line connection conducting wire layer area bridgeable by a bonding wire, so that the broken data line is reconnected.

12. The method of claim 11, wherein the data line connection conducting wire layer is located below the data lines.

13. The method of claim 11, wherein the step of forming a gate line connection conducing wire layer between the gate lines and the substrate and below the gate lines comprises:

depositing an ITO conducting layer and a gate metal layer sequentially on the substrate, and processing the ITO conducting layer and the gate metal layer by performing a patterning process one time so as to form the gate line connection conducting wire layer and the gate lines, wherein the gate line connection conducting wire layer is located below the gate lines and corresponds to the gate lines.

14. The method of claim 11, wherein in the step of forming a data line connection conducting wire layer in regions of the array substrate corresponding to the data lines, the data line connection conducting wire layer is formed below the data lines.

15. The method of claim 14, wherein the step of forming a data line connection conducting wire layer in regions of the array substrate corresponding to the data lines comprises:

depositing an ITO conducting layer on regions of the substrate corresponding to regions where the data lines is to be provided, and processing the ITO conducting layer through a patterning process to form the data line connection conducting wire layer;

depositing the gate insulation layer on the data line connection conducting wire layer; and depositing a data line metal layer, and processing the metal layer through a patterning process to form the data lines.

* * * * *